United States Patent [19]
Huusko

[11] Patent Number: 5,194,826
[45] Date of Patent: Mar. 16, 1993

[54] CIRCUITRY ARRANGEMENT FOR THE ELIMINATION OF SPURIOUS RESPONSE IN A RADIO TELEPHONE RECEIVER

[75] Inventor: Risto Huusko, Salo, Finland

[73] Assignee: Nokia Mobile Phones Ltd., Salo, Finland

[21] Appl. No.: 699,302

[22] Filed: Apr. 12, 1991

[30] Foreign Application Priority Data

Apr. 27, 1990 [FI] Finland .................................. 902149

[51] Int. Cl.⁵ .............................................. H03F 3/191
[52] U.S. Cl. ..................................... 330/302; 330/306
[58] Field of Search ............... 330/149, 302, 303, 304, 330/305, 306; 455/341, 311

[56] References Cited

U.S. PATENT DOCUMENTS

| | | | |
|---|---|---|---|
| 3,585,519 | 6/1971 | Burgess | 330/306 |
| 3,860,881 | 1/1975 | Etherington et al. | 330/21 |
| 4,464,636 | 8/1984 | Dobrovolny | 330/304 X |
| 4,601,062 | 7/1986 | Hettiger | 455/285 |
| 4,743,873 | 5/1988 | Schultz et al. | 333/175 |

FOREIGN PATENT DOCUMENTS

| | | |
|---|---|---|
| 0201986 | 6/1986 | European Pat. Off. |
| 2425674 | 4/1975 | Fed. Rep. of Germany |
| 2733316 | 8/1979 | Fed. Rep. of Germany |
| 3228449 | 9/1984 | Fed. Rep. of Germany |

OTHER PUBLICATIONS

Transistor Televison Picture IF Double Tuned Amplifiers by H. C. Lee. May 1959, pp. 25-32.
Patent Abstracts of Japan; High Frequency Amplifier JP-A-02-05809; Matsushita Electric Ind. Co., Ltd., Feb. 28, 1990.

Primary Examiner—Steven Mottola
Attorney, Agent, or Firm—Darby & Darby

[57] ABSTRACT

The invention relates to a circuitry arrangement by means of which it is possible to suppress frequency components which cause spurious response in the intermediate frequency amplifier in a radio telephone receiver. The amplifier produces not only the input signal frequency but also harmonic frequencies of this frequency, in which case some harmonic frequency of the frequency component which causes spurious response is the same as the intermediate frequency. In the circuitry, between the signal path and the circuit ground, there is a circuit which is in series resonance at the frequency of the frequency component which causes spurious response, in which case a signal of this frequency is strongly attenuated, and the circuit is in parallel resonance at the intermediate frequency, in which case attenuation of a signal of this frequency is slight. It is possible to select an intermediate-frequency which is lower than the reception band multiplied by two, so that even strict requirements set on spurious response can be satisfied.

4 Claims, 1 Drawing Sheet

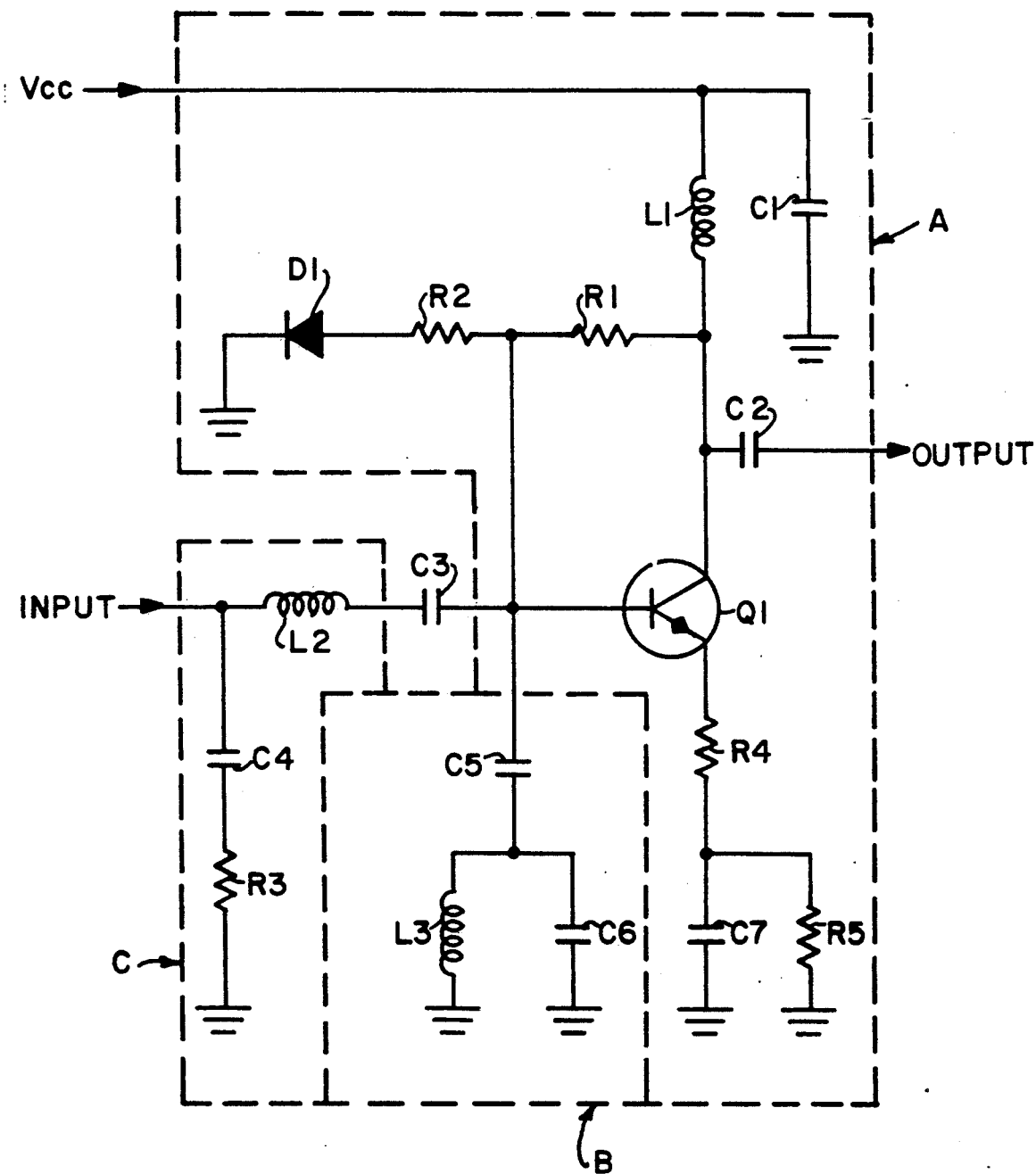

CIRCUITRY ARRANGEMENT FOR THE ELIMINATION OF SPURIOUS RESPONSE IN A RADIO TELEPHONE RECEIVER

BACKGROUND OF THE INVENTION

The invention relates to a circuitry arrangement by means of which it is possible to suppress the frequency components which cause spurious response in the intermediate-frequency amplifier of a radio telephone receiver, the amplifier producing not only the output signal frequency but also harmonic frequencies of this frequency, in which case some harmonic frequency of the frequency component which causes spurious response is the same as the intermediate frequency.

Usually in radio telephones the received radio signal is directed from the antenna to a duplexer, from which it is directed via a first amplifier of the front end of the receiver part and a fixed bandpass filter to a first mixer, in which it is mixed with the local-oscillator frequency, and the intermediate frequency is filtered from the output results.

The intermediate-frequency signal is amplified before it is directed to a second mixer. For reasons of component costs and in order to simplify the basic construction of the receiver it would be advantageous to select a low intermediate frequency, but the spurious response caused by the slight non-linearity of the intermediate-frequency amplifier operating at the first intermediate frequency causes problems. A spurious response is produced because the intermediate-frequency amplifier, being a slightly non-linear circuit, as stated above, produces not only the amplified basic-frequency input signal but also multiple frequencies of this frequency. If a signal, the frequency of which is one-half of the intermediate frequency, arrives at the input of such an amplifier, there can be measured in the output of the amplifier also an intermediate-frequency signal which is to be regarded as a spurious response.

When the intermediate frequency is sufficient in relation to the reception band, at least greater than 1× the width of the reception band, the frequency components producing the spurious response can be filtered with fixed filters in the high-frequency parts of the receiver. For this reason the first intermediate frequency is usually selected so as to be sufficiently high, even though the components to be used are more difficult to manufacture and are thus expensive. For example, in the NMT radio telephone system the width of the reception band is 25 MHz and the intermediate frequency is over 50 MHz, for example 87 MHz. Spurious response does not always cause great harm, especially if the amplitude of the input signal which produces it is low, but in certain radio telephone systems the spurious response rejection required of a telephone is so great that the receiver will not operate in accordance with the specifications without a separate method for rejecting the spurious response caused by harmonic components.

SUMMARY OF THE INVENTION

The object of the present invention is to present a which enables a lower-than-usual intermediate frequency to be used without harmful spurious-response frequencies being produced in the intermediate-frequency amplifier.

This object is achieved according to the invention in such a way that in front of the intermediate-frequency amplifier, between the signal path and the circuit ground, there is coupled a resonant circuit which is in series resonance at a frequency which is one-half of the intermediate frequency, in which case a signal of this frequency is sharply attenuated, and is in parallel resonance when the frequency is the intermediate frequency, in which case the attenuation of a signal at this frequency is slight.

BRIEF DESCRIPTION OF THE DRAWING

The invention is described in greater detail with reference to the accompanying FIGURE, which depicts an intermediate-frequency amplifier with a resonance circuit in front of it.

DESCRIPTION OF THE PREFERRED EMBODIMENTS

In block A there is depicted an intermediate-frequency coupling implemented with one transistor Q1, to the input of which is applied a filtered intermediate-frequency signal obtained from a first mixer of the receiver and from a output of which is obtained an amplified intermediate-frequency signal. The components L1, C1, R1, R2, D1, R4, R5, C7, and C2 of block A are associated with the biasing and temperature compensation of the amplifier and are not significant in terms of the invention.

Mixing resultants other than the desired frequency also arrive at the input of a amplifier, in which case, when the mixing resultant is one-half of the desired frequency, its other harmonic frequency can be seen at the intermediate frequency in the output due to the non-linearity of the amplifier. This is a harmful spurious-response frequency.

In order to eliminate this detrimental input frequency, a resonant circuit B is coupled in front of the amplifier, between the signal path and the circuit ground, in this case between the base and the ground of the transistor Q1. The resonant circuit comprises an inductance L3 and a capacitance C6 coupled in parallel and, in series with them, a capacitance C5. The circuit is in series resonance at a frequency which is one-half of the intermediate frequency, for example at a frequency of 22.5 MHz when an intermediate frequency of 45 MHz is used. In this case the impedance of the resonant circuit is very low, and the 22.5 MHz frequency component is strongly attenuated before the amplifier block A, and the second harmonic visible in the output of the amplifier block A is thus so small that the spurious response rejection requirement determined in the specification is fulfilled. The same resonance circuit B is in parallel resonance at the intermediate frequency, e.g. 45 MHz, in which case, its impedance is very high and thus does not attenuate the intermediate-frequency signal.

By means of the block C in the input of the amplifier block A, the impedance seen by higher radio frequencies is arranged to be approx. 50 ohm, in which case the receiver circuits preceding the intermediate-frequency amplifier block A and the resonant circuit B see an impedance advantageous in terms of their operation. This block C comprises a series coil L2 and a series coupling of a resistance R3, parallel with respect to the signal path, and of a capacitor C4. The capacitor C3 is a conventionally used differential capacitor.

The embodiment described above is only one example of the possible implementations according to the claims. The resonant circuit B can be implemented with many different circuitry combinations, as long as it implements the same electric properties as does the resonance circuit described above, which has been implemented by using a minimum number of components. The resonance circuit B can also, by suitable dimensioning, be used as adaptor means for adapting the intermediate-frequency amplifier to the preceding circuit. In this case the block C is not necessarily needed.

The invention described makes it possible to select an intermediate frequency which is lower than the reception band multiplied by two, so that even strict requirements set on spurious response can be fulfilled.

I claim:

1. A circuit arrangement for suppressing frequency components causing spurious response in an intermediate-frequency amplifier, the amplifier producing not only an input signal frequency but also harmonic frequencies of this frequency, in which case some harmonic frequency of a frequency component causing spurious response is the same as the intermediate frequency, comprising a filter circuit in front of the amplifier between a signal path and a circuit ground, said filter circuit including components selected to be in series resonance at the frequency which causes spurious response so that such signal is strongly attenuated, and components selected to be in parallel resonance at the intermediate frequency so the attenuation of a signal of this intermediate frequency is slight.

2. A circuitry arrangement according to claim 1, wherein the filter circuit is in series resonance at a frequency which is one-half of the intermediate frequency.

3. A circuitry arrangement according to claim 1, wherein the filter circuit adapts the impedance of the intermediate-frequency amplifier to receive circuits preceding it.

4. A circuitry arrangement according to claim 1, where in front of the filter circuit is coupled an adapter circuit, the input impedance of said adapter circuit at the intermediate frequency is approximately 50 ohm, whereby receiver circuits preceding the intermediate-frequency amplifier see an impedance advantageous in terms of their operation.

* * * * *